United States Patent
Saito et al.

(10) Patent No.: US 9,985,599 B2
(45) Date of Patent: May 29, 2018

(54) QUARTZ VIBRATOR MANUFACTURING METHOD AND QUARTZ VIBRATOR

(71) Applicant: MURATA MANUFACTURING CO., LTD., Nagaokakyo-shi, Kyoto-Fu (JP)

(72) Inventors: Yoshifumi Saito, Nagaokakyo (JP); Hiroaki Kaida, Nagaokakyo (JP); Manabu Ibayashi, Nagaokakyo (JP); Yuichiro Nagamine, Nagaokakyo (JP); Katsuma Moroishi, Nagaokakyo (JP); Takuya Kono, Nagaokakyo (JP); Kazuhiro Mimura, Nagaokakyo (JP)

(73) Assignee: MURATA MANUFACTURING CO., LTD., Nagaokakyo-shi, Kyoto-fu (JP)

( * ) Notice: Subject to any disclaimer, the term of this patent is extended or adjusted under 35 U.S.C. 154(b) by 856 days.

(21) Appl. No.: 14/486,214

(22) Filed: Sep. 15, 2014

(65) Prior Publication Data
US 2015/0001997 A1    Jan. 1, 2015

Related U.S. Application Data

(63) Continuation of application No. PCT/JP2013/063753, filed on May 17, 2013.

(30) Foreign Application Priority Data

May 18, 2012  (JP) .................................. 2012-113935

(51) Int. Cl.
*H01L 41/053*  (2006.01)
*H01L 41/09*  (2006.01)
(Continued)

(52) U.S. Cl.
CPC ............... *H03H 3/02* (2013.01); *H01L 21/50* (2013.01); *H03H 9/0519* (2013.01);
(Continued)

(58) Field of Classification Search
CPC ...... H03H 3/02; H03H 9/0519; H03H 9/1021; H03H 9/19; H01L 21/50
(Continued)

(56) References Cited

U.S. PATENT DOCUMENTS 5,585,687 A    12/1996  Wakabayashi et al.
5,825,120 A *  10/1998  Maesaka .............. H03H 9/1014
                                                     310/340

(Continued)

FOREIGN PATENT DOCUMENTS

CN    101884168 A    11/2010
JP    08-018380    1/1996
(Continued)

OTHER PUBLICATIONS

PCT/JP2013/063753 Written Opinion dated Jul. 12, 2013.

*Primary Examiner* — Thomas Dougherty
(74) *Attorney, Agent, or Firm* — Arent Fox LLP

(57) ABSTRACT

A method capable of manufacturing a quartz vibrator by disposing a metallic bonding material on one main surface of a ceramic plate having a quartz vibrating element mounted thereon. Thereafter, the bonding of a cap having a recess to the ceramic plate by disposing the cap on the one main surface of the ceramic plate so that an open side of the recess faces the ceramic plate, melting the bonding material, and then allowing the bonding material to set, is carried out.

12 Claims, 3 Drawing Sheets

(51) Int. Cl.
*H03H 3/02* (2006.01)
*H03H 9/19* (2006.01)
*H01L 21/50* (2006.01)
*H03H 9/05* (2006.01)
*H03H 9/10* (2006.01)

(52) U.S. Cl.
CPC ............ *H03H 9/1021* (2013.01); *H03H 9/19* (2013.01); *Y10T 29/42* (2015.01)

(58) Field of Classification Search
USPC .................. 310/340, 344, 348, 361, 364
See application file for complete search history.

(56) References Cited

U.S. PATENT DOCUMENTS

| | | | | |
|---|---|---|---|---|
| 5,875,099 A | * | 2/1999 | Maesaka | H03H 9/1014 310/344 |
| 5,880,553 A | * | 3/1999 | Okeshi | H03H 9/0514 310/344 |
| 5,886,457 A | * | 3/1999 | Maesaka | H01L 23/10 257/E23.193 |
| 6,570,299 B2 | * | 5/2003 | Takeshima | H04R 17/00 29/25.35 |
| 7,489,208 B2 | * | 2/2009 | Moriya | H03B 5/36 310/340 |
| 8,330,336 B2 | | 12/2012 | Kameda et al. | |
| 2010/0231094 A1 | | 9/2010 | Kameda et al. | |

FOREIGN PATENT DOCUMENTS

| | | |
|---|---|---|
| JP | 2004015604 A | 1/2004 |
| JP | 2004-186995 A | 7/2004 |
| JP | 2004-202604 | 7/2004 |
| JP | 2005-72050 A | 3/2005 |
| JP | 2011-9808 A | 1/2011 |
| JP | 2011-066651 A | 3/2011 |
| WO | WO-2009-072351 A1 | 6/2009 |

* cited by examiner

QUARTZ VIBRATOR MANUFACTURING METHOD AND QUARTZ VIBRATOR

CROSS REFERENCE TO RELATED APPLICATIONS

The present application is a continuation of International application No. PCT/JP2013/063753, filed May 17, 2013, which claims priority to Japanese Patent Application No. 2012-113935, filed May 18, 2012, the entire contents of each of which are incorporated herein by reference.

FIELD OF THE INVENTION

The present invention relates to quartz vibrator manufacturing methods and to quartz vibrators.

BACKGROUND OF THE INVENTION

Quartz vibrators having quartz vibrating elements are known conventionally. Quartz vibrators are easily susceptible to frequency variations due to external disturbances. Accordingly, in quartz vibrators, the quartz vibrating element is disposed within a sealed space.
Patent Document 1: Japanese Unexamined Patent Application Publication No. 2004-202604

SUMMARY OF THE INVENTION

Patent Document 1 discloses a package structure including a substrate on a main surface of which a device is disposed, and a cap, having a recess that is open on the side of the cap that faces the substrate, disposed on the substrate so as to cover the device. According to Patent Document 1, a brazing material composed of an Au/Sn alloy is disposed on an end surface of the cap through metallic paste printing, plating, or the like. The cap and the substrate are bonded to each other using the brazing material.

Applying the package structure and manufacturing method thereof according to Patent Document 1 to a quartz vibrator can be considered. However, according to the package structure and manufacturing method thereof disclosed in Patent Document 1, it is necessary to form a bonding material with a high level of precision on the extremely narrow end surface of a cap through metallic paste printing, plating, or the like. Accordingly, it has been difficult to form the bonding material with a high level of precision.

The present invention provides a method capable of easily manufacturing a quartz vibrator having high frequency precision.

A quartz vibrator manufacturing method according to the present invention includes a bonding material disposing step of disposing a metallic bonding material on one main surface of a ceramic plate on the one main surface of which a quartz vibrating element is mounted, and a bonding step of bonding a cap having a recess to the ceramic plate by disposing the cap on the one main surface of the ceramic plate so that an open side of the recess faces the ceramic plate, melting the bonding material, and then allowing the bonding material to set.

According to a specific aspect of the quartz vibrator manufacturing method of the present invention, the cap includes a cap main body, and a metallic layer provided on at least an end surface and a side surface of a bonding area of the cap main body that is bonded to the ceramic plate. Furthermore, wettability of the metallic layer with respect to the melted bonding material is higher than wettability of the cap main body with respect to the melted bonding material.

According to another specific aspect of the quartz vibrator manufacturing method of the present invention, the bonding material contains an Au/Sn alloy. The metallic layer contains Au.

According to another specific aspect of the quartz vibrator manufacturing method of the present invention, in the bonding material disposing step, the bonding material is disposed having a greater surface area than the end surface of the bonding area of the cap where the cap and the ceramic plate are bonded to each other.

According to yet another specific aspect of the quartz vibrator manufacturing method of the present invention, the bonding step is carried out so that the bonding material extends onto the side surface of the bonding area of the cap where the cap and the ceramic plate are bonded to each other.

According to yet another specific aspect of the quartz vibrator manufacturing method of the present invention, in the bonding material disposing step, the bonding material is disposed on the one main surface of the ceramic plate by applying a metallic paste or through plating.

A quartz vibrator according to the present invention includes a ceramic plate, first and second conductors, a cap, and a quartz vibrating element. The first and second conductors are formed on one main surface of the ceramic plate. The cap is mounted on the first conductor and has a recess whose open side faces the ceramic plate. The quartz vibrating element is mounted on the second conductor so as to be contained within the recess of the cap. The cap includes a bonding area that serves as a side wall of the recess, the first conductor has a contour that corresponds to the bonding area, an end surface and both side surfaces of the bonding area are bonded to the first conductor via a bonding material configured of a metal, a sealed space is formed by the ceramic plate, the first conductor, the bonding material, and the cap, and the quartz vibrating element is disposed within the sealed space.

According to another specific aspect of the quartz vibrator of the present invention, the bonding material is bonded to the first conductor so as to cover the first conductor.

According to yet another specific aspect of the quartz vibrator of the present invention, the bonding material has a fillet shape.

According to yet another specific aspect of the quartz vibrator of the present invention, a length, in the height direction of the cap, of an area where the bonding material and a side surface of the bonding area of the cap are bonded to each other is greater than a width of the end surface of the bonding area of the cap.

According to another specific aspect of the quartz vibrator of the present invention, the first conductor is formed having a frame shape.

According to another specific aspect of the quartz vibrator of the present invention, the first conductor is formed having a long, semi-oval shape when viewed as a cross-section.

According to yet another specific aspect of the quartz vibrator of the present invention, the first conductor is configured of a base layer and a plating layer formed on the base layer, and the base layer is covered by the plating layer so that the base layer is not exposed to the exterior.

According to yet another specific aspect of the quartz vibrator of the present invention, a width of the first conductor is greater than a width of the end surface of the bonding area of the cap.

According to another specific aspect of the quartz vibrator of the present invention, the bonding area of the cap has a shape in which a tip of the bonding area extends in a rounded shape.

According to yet another specific aspect of the quartz vibrator of the present invention, the first conductor contains Au on an outer surface thereof, the cap contains Au on an outer surface thereof, and the bonding material contains Au.

According to yet another specific aspect of the quartz vibrator of the present invention, the first conductor has an Au plating layer in an outermost layer of the first conductor, the cap has an Au plating layer in an outermost layer of the cap, and the bonding material is an Au/Sn alloy.

According to the present invention, a method capable of easily manufacturing a quartz vibrator having high frequency precision on one main surface of a ceramic plate can be provided.

DETAILED DESCRIPTION OF THE PREFERRED EMBODIMENTS

Figure 1:
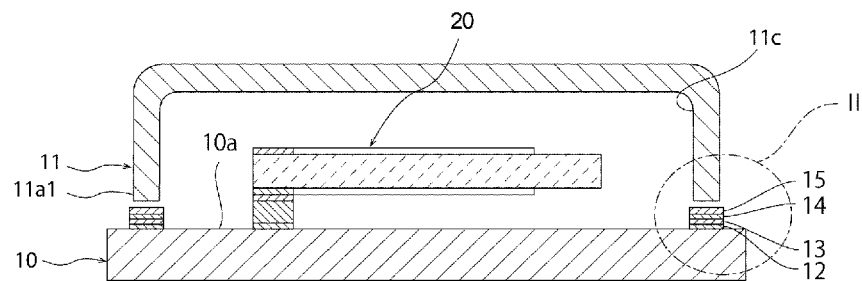
FIG. 1 is a schematic cross-sectional view illustrating a process for manufacturing a quartz vibrator according to an embodiment of the present invention.

Examples of preferred embodiments for carrying out the present invention will be described hereinafter. Note, however, that the following embodiments are merely examples. The present invention is not intended to be limited to the following embodiments in any way.

Furthermore, in the drawings referred to in the embodiments and the like, members having functions that are substantially identical are given identical reference numerals. The drawings referred to in the embodiments and the like are schematic depictions, and as such the ratios of dimensions and so on of objects depicted in the drawings may differ from the actual ratios of dimensions and so on of those objects. The ratios of dimensions and so on of the objects may differ from drawing to drawing as well. The specific ratios of dimensions and so on of objects should be understood from the following descriptions.

Figure 3:
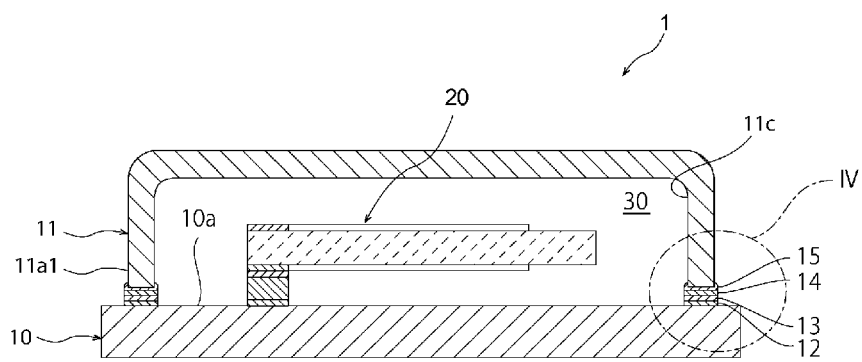
FIG. 3 is a schematic cross-sectional view illustrating a quartz vibrator manufactured according to an embodiment of the present invention.
Figure 4:
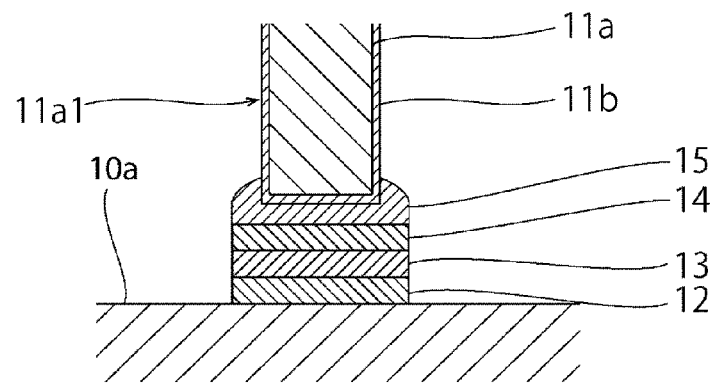
FIG. 4 is a schematic cross-sectional view illustrating an area IV shown in FIG. 3.

The present embodiment describes a manufacturing method and configuration of a quartz vibrator 1 illustrated in FIGS. 3 and 4.

(Bonding Material Disposing Process)

First, as shown in FIG. 1, a ceramic plate 10 on a main surface 10a of which is mounted a quartz vibrating element 20 is prepared. The ceramic plate 10 can be configured of alumina, for example.

Next, a metallic bonding material 15 is disposed upon the main surface 10a of the ceramic plate 10. Specifically, a conductor 12, configured of a Ni plating film or the like, for example, is disposed on the main surface 10a. A Pd plating film 13 and an Au plating film 14 are then formed on the conductor 12 in that order. The bonding material 15 is then formed on the Au plating film 14. The bonding material 15 can be configured of an Au/Sn alloy, for example. The bonding material 15 can be formed by applying a metallic paste, through plating, or the like, for example.

(Bonding Process)

Figure 2:
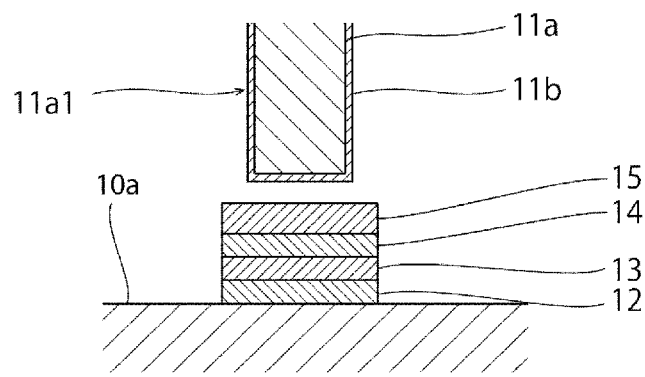
FIG. 2 is a schematic cross-sectional view illustrating an area II shown in FIG. 1.

Next, a dome-shaped cap 11 having a recess 11c is prepared. The cap 11 is a member for defining and forming, along with the ceramic plate 10, a sealed space in which the quartz vibrating element 20 is disposed. The cap 11 can be configured of a suitable metal, such as a Ni alloy, for example. Specifically, in the present embodiment, the cap 11 includes a cap main body 11a and a metallic layer 11b, as shown in FIG. 2. The cap main body 11a can be configured of a suitable metal, such as a Ni alloy, for example. The metallic layer 11b is provided on at least side surfaces and an end surface of a bonding area 11a1 of the cap main body 11a, the bonding area 11a1 being an area that is bonded to the ceramic plate 10. Specifically, in the present embodiment, the metallic layer 11b is provided on the entire surface of the cap main body 11a. For example, in the case where the bonding material 15 is configured of an Au/Sn alloy, it is preferable for the metallic layer 11b to be configured of Au or an alloy that contains Au, for example.

Next, the cap 11 is disposed on the main surface 10a of the ceramic plate 10 so that the open side of the recess 11c faces the ceramic plate 10. At this time, the cap 11 is disposed so that the bonding area 11a1 of the cap 11 is positioned on the bonding material 15.

Next, the quartz vibrator 1 can be completed by melting the bonding material 15 and then allowing the bonding material 15 to set while pressing the cap 11 onto the bonding material 15, which causes the bonding material 15 to bond the cap 11 and the ceramic plate 10 together. It is preferable for this process to be carried out at a certain temperature approximately between 280° C. and 350° C. for a certain time between one and 60 minutes, in a reduced-pressure atmosphere in which the pressure is approximately between $10^{-3}$ Pa and $10^{-4}$ Pa. Furthermore, it is preferable for this process to be carried out so that the bonding material 15 is also bonded to the side surfaces of the bonding area 11a1 of the cap 11.

Herein, for example, providing the bonding material on an end surface of the cap and bonding the cap to the ceramic plate can also be considered. However, because the end surface of the cap is extremely narrow, it is difficult to form the bonding material through metallic paste printing, plating, or the like. In the case where the bonding material is provided on the end surface of the cap, a method that disposes on the end surface of the cap a metal foil that has been stamped into a shape that conforms to the shape of the end surface of the cap can be favorably used. However, in the case where the bonding material is manufactured through such stamping, dust particles from the bonding material are easily produced due to burrs and the like produced in the bonding material. Frequency characteristics of the quartz vibrating element change greatly due to such dust particles and the like, which leads to an increase in manufacturing variations in the frequency characteristics from quartz vibrator to quartz vibrator.

However, in the case where the bonding material 15 is disposed on the ceramic plate 10 as in the present embodiment, the bonding material 15 can be formed suitably by applying a metallic paste, through plating, or the like. Accordingly, dust particles can be suppressed from being produced from the bonding material 15. Accordingly, it is possible to reduce variations in the frequency characteristics of the quartz vibrator 1.

In the case where the bonding material is manufactured through stamping, the size of the bonding material will be greater, and as such a greater amount of components that cause outgassing, such as moisture and the like, will be contained in the bonding material. The characteristics of the quartz vibrator also change in the case where minute amounts of gas have adhered thereto, and thus there will be increased variations in the characteristics of the quartz vibrator when using a bonding material that has been manufactured through stamping and that contains a greater amount of components that cause outgassing.

As opposed to this, it is easy to reduce the volume of the bonding material 15 in the case where the bonding material 15 is formed by applying a metallic paste, through plating, or the like. Accordingly, the amount of components contained in the bonding material 15 that cause outgassing can be reduced. Thus, it is possible to reduce variations in the characteristics of the quartz vibrator.

In the case where the bonding material 15 is disposed on the ceramic plate 10 and the ceramic plate 10 and the cap 11 are bonded to each other while pressing the cap 11 onto the ceramic plate 10, the bonding material 15 is bonded to the side surfaces of the bonding area 11a1 of the cap 11 in addition to the end surface thereof, as shown in FIGS. 3 and 4. Accordingly, the cap 11 can be rigidly bonded to the ceramic plate 10. As a result, the seal of a sealed space 30 that is defined and formed by the cap 11 and the ceramic plate 10 and in which the quartz vibrating element 20 is disposed can be improved. Thus, it is possible to obtain a quartz vibrator 1 whose frequency characteristics do not easily change.

From the standpoint of bonding the bonding material 15 more strongly to the side surfaces of the bonding area 11a1, it is preferable to select the material of which the metallic layer 11b is configured so that the wettability of the metallic layer 11b with respect to the melted bonding material 15 is greater than the wettability of the cap main body 11a with respect to the bonding material 15. Specifically, in the case where the bonding material 15 contains an Au/Sn alloy, it is preferable for the metallic layer 11b to be configured of Au or an Au alloy, which has a high wettability with respect to the Au/Sn alloy. As shown in FIGS. 1 and 2, in the process of disposing the bonding material, it is preferable to dispose the bonding material 15 having a greater surface area than the end surface of the bonding area 11a1. It is preferable for the bonding material 15 to be provided so that the bonding material 15 is located on both an outer side portion and an inner side portion of the bonding area 11a1 when viewed from above.

Figure 5:
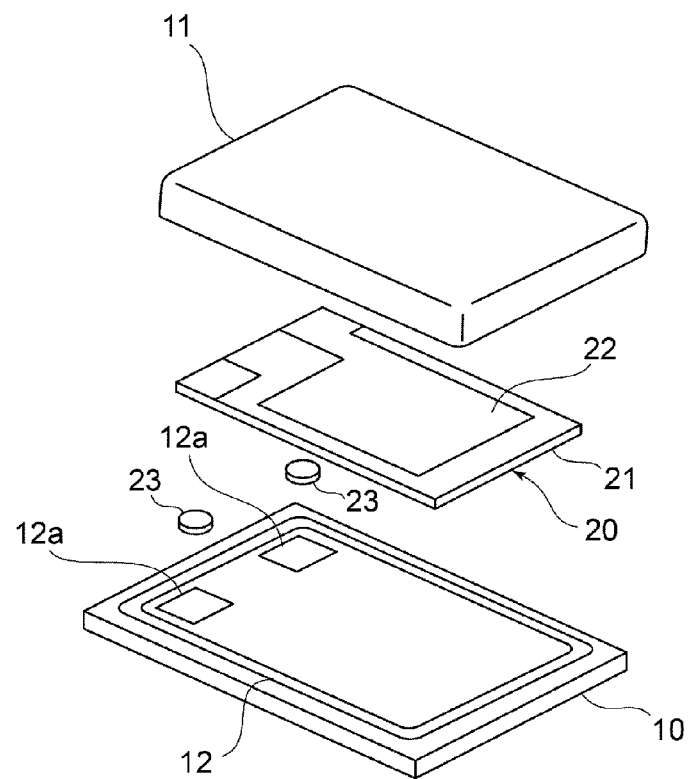
FIG. 5 is an exploded perspective view illustrating a quartz vibrator according to another embodiment of the present invention.
Figure 6:
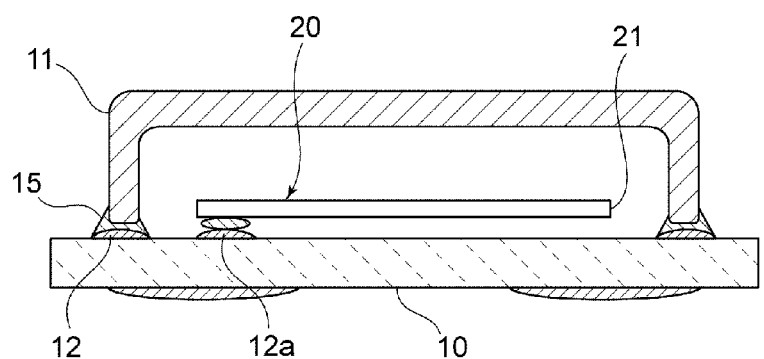
FIG. 6 is a front cross-sectional view illustrating the quartz vibrator according to the embodiment illustrated in FIG. 5.
Figure 7:
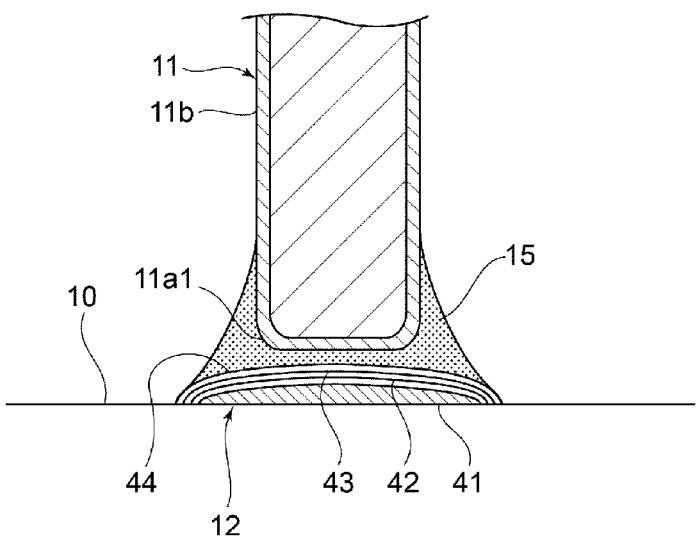
FIG. 7 is a partial cut-out cross-sectional view illustrating an area where a cap and a ceramic plate are bonded in the quartz vibrator illustrated in FIGS. 5 and 6.

FIGS. 5 to 7 are diagrams illustrating the configuration of a quartz vibrator according to another embodiment of the present invention in more detail, where FIG. 5 is an exploded perspective view illustrating an overview of the quartz vibrator 1, FIG. 6 is a schematic cross-sectional view illustrating the quartz vibrator 1, and FIG. 7 is a partial cut-out cross-sectional view illustrating an area where the ceramic plate 10 and the cap 11 are bonded in the quartz vibrator.

As shown in FIG. 5, in the quartz vibrating element 20, electrodes 22 are formed on the front and rear surfaces of a quartz chip 21 (the electrode on the rear side is not shown).

The electrodes oppose each other in the thickness direction of the quartz chip. The electrodes formed on the quartz vibrating element 20 are electrically connected to conductors 12a and 12a formed on one main surface of the ceramic plate 10 via conductive adhesives 23 and 23. The conductors 12a are electrically connected to an outer electrode formed on another main surface of the ceramic plate 10 via a via conductor (not shown) formed in the ceramic plate 10.

The conductor 12 has a contour that corresponds to the bonding area 11a1 of the cap 11 on the one main surface of the ceramic plate 10. Specifically, the conductor 12 is formed having a frame shape.

As shown in FIGS. 6 and 7, the conductor 12 has a long, semi-oval shape when viewed as a cross-section. Here, the conductor 12 is formed of a base layer 41 containing Mo, a Ni plating layer 42, a Pd plating layer 43, and an Au plating layer 44, in that order from the bottom. The base layer is covered by the plating layers formed thereabove, and as such is not exposed to the exterior. Note that the conductors 12a and the outer electrode can be configured having the same layer structure as the conductor 12.

As shown in FIG. 7, the bonding area 11a1 of the cap 11 has a shape in which a tip thereof extends in a rounded shape. This shape provides an effect of smoothing the wetting of the bonding material 15, which will be mentioned later. The cap 11 has the metallic layer 11b on a surface thereof, and the metallic layer 11b is configured of a plating layer configured of Au or an Au alloy.

As shown in FIGS. 6 and 7, the ceramic plate 10 and the cap 11 are bonded to each other via the bonding material 15. The bonding material is configured of an Au/Sn alloy. As described earlier, the bonding material 15 is temporarily melted when bonding the cap 11, and is then set. The metallic layer 11b of the cap 11, the outermost plating layer of the conductor 12, and the bonding material 15 each contain Au, and thus are easily wetted each other. The bonding material 15 thus takes on a fillet shape after setting. The bonding material 15 wets the cap 11 up to the side surfaces thereof, in addition to the end surface thereof. Furthermore, the bonding material 15 spreads out to cover the plating layer of the conductor 12.

Accordingly, the base layer 41 of the conductor 12, which is relatively porous, is covered by a plating layer. As such, the base layer 41 is not exposed to the exterior, which makes it difficult for moisture and so on to enter via the base layer 41. A border between the bonding material 15 and the cap 11 and a border between the bonding material 15 and the conductor 12 are widely sealed as a result of the bonding material 15 spreading out. A path through which moisture and the like enter is lengthened as a result, which makes it difficult for moisture and the like to enter.

Accordingly, the sealed space formed by the ceramic plate 10, the conductor 12, the bonding material 15, and the cap 11 is sealed with certainty. The precision of the frequency of the quartz vibrator 1 stabilizes as a result.

REFERENCE SIGNS LIST 1 quartz vibrator
10 ceramic plate
10a main surface
11 cap
11a cap main body
11a1 bonding area
11b metallic layer
11c recess
12 conductor (first conductor)

12*a* conductor (second conductor)
13 Pd plating layer
14 Au plating layer
15 bonding material
20 quartz vibrating element
30 sealed space

The invention claimed is:

1. A quartz vibrator comprising:
a ceramic plate;
first and second conductors on one main surface of the ceramic plate;
a metal bonding material on the first conductor;
a cap on the metal bonding material, the cap having a recess facing the ceramic plate and a bonding area that includes a side wall of the recess; and
a quartz vibrating element on the second conductor and contained within the recess of the cap,
wherein: 4
  the first conductor has a contour that corresponds to the bonding area;
  an end surface and side surfaces of the bonding area are bonded to the metal bonding material;
  a sealed space is formed by the ceramic plate, the first conductor, the metal bonding material, and the cap;
  the quartz vibrating element is disposed within the sealed space; and
  the first conductor includes a base layer and a plating layer on the base layer, and the base layer is covered by the plating layer so that the base layer is not exposed.

2. The quartz vibrator according to claim 1, wherein the metal bonding material is bonded to the first conductor so as to cover the first conductor.

3. The quartz vibrator according to claim 1, wherein the metal bonding material has a fillet shape.

4. The quartz vibrator according to claim 1, wherein a length, in a height direction of the cap, of an area where the bonding material and one of the side surfaces of the bonding area of the cap are bonded to each other is greater than a width of the end surface of the bonding area of the cap.

5. The quartz vibrator according to claim 1, wherein the first conductor has a frame shape.

6. The quartz vibrator according to claim 1, wherein the first conductor has a semi-oval shape when viewed as a cross-section.

7. The quartz vibrator according to claim 1, wherein a width of the first conductor is greater than a width of the end surface of the bonding area of the cap.

8. The quartz vibrator according to claim 1, wherein the bonding area of the cap has a shape in which a tip of the bonding area has a rounded shape.

9. The quartz vibrator according to claim 1, wherein:
the first conductor contains Au on an outer surface of the first conductor;
the cap contains Au on an outer surface of the cap; and
the bonding material contains Au.

10. The quartz vibrator according to claim 1, wherein:
the first conductor has an Au plating layer in an outermost layer of the first conductor;
the cap has an Au plating layer in an outermost layer of the cap; and
the bonding material is an Au/Sn alloy.

11. The quartz vibrator according to claim 6, wherein:
the cap includes a cap main body, and a metallic layer on at least the end surface and the side surfaces of the bonding area; and
a wettability of the metallic layer with respect to the metal bonding material is higher than a wettability of the cap main body with respect to the metal bonding material.

12. The quartz vibrator according to claim 1, wherein:
the cap includes a cap main body, and a metallic layer on at least the end surface and the side surfaces of the bonding area; and
a wettability of the metallic layer with respect to the metal bonding material is higher than a wettability of the cap main body with respect to the metal bonding material.

* * * * *